(12) United States Patent
Yen et al.

(10) Patent No.: US 10,302,246 B2
(45) Date of Patent: May 28, 2019

(54) SUPPORTING FRAME

(71) Applicant: SYNCMOLD ENTERPRISE CORP., New Taipei (TW)

(72) Inventors: Ching-Hui Yen, New Taipei (TW); Chien-Cheng Yeh, New Taipei (TW)

(73) Assignee: SYNCMOLD ENTERPRISE CORP., New Taipei (TW)

( * ) Notice: Subject to any disclaimer, the term of this patent is extended or adjusted under 35 U.S.C. 154(b) by 31 days.

(21) Appl. No.: 15/820,889

(22) Filed: Nov. 22, 2017

(65) Prior Publication Data
US 2019/0017650 A1 Jan. 17, 2019

(51) Int. Cl.
| | |
|---|---|
| *F16M 11/06* | (2006.01) |
| *F16M 11/20* | (2006.01) |
| *H05K 5/02* | (2006.01) |
| *F16M 11/38* | (2006.01) |

(52) U.S. Cl.
CPC ..... *F16M 11/2042* (2013.01); *F16M 11/2092* (2013.01); *F16M 11/38* (2013.01); *H05K 5/0234* (2013.01); *F16M 11/06* (2013.01); *F16M 2200/00* (2013.01); *F16M 2200/021* (2013.01); *F16M 2200/022* (2013.01); *F16M 2200/063* (2013.01)

(58) Field of Classification Search
USPC ....... 248/447, 454, 455, 456, 458, 133, 136, 248/137, 138, 139, 140, 141, 142, 371, 248/372.1, 393, 394, 395, 396, 397, 248/222.13; 403/166, 364; 16/303, 325, 16/341, 432
See application file for complete search history.

(56) References Cited

U.S. PATENT DOCUMENTS

| | | | |
|---|---|---|---|
| 4,726,556 A * | 2/1988 | Weir | A47B 27/18 248/454 |
| 5,039,118 A * | 8/1991 | Huang | B62B 9/20 280/47.371 |
| 7,031,466 B2 * | 4/2006 | Lu | H04M 1/0216 16/303 |
| 7,096,536 B2 * | 8/2006 | Johnson | E05D 11/1085 16/300 |
| 7,252,277 B2 | 8/2007 | Sweere et al. | |
| 7,383,618 B2 * | 6/2008 | Lu | H04M 1/0216 16/303 |
| 8,925,153 B1 * | 1/2015 | McGrath | E05D 11/1007 16/326 |
| 9,399,882 B1 * | 7/2016 | McGrath | E05D 11/1007 |
| 2004/0177477 A1 * | 9/2004 | Hsieh | H04M 1/0216 16/303 |
| 2005/0091795 A1 * | 5/2005 | Jeong | H04M 1/0227 16/303 |

* cited by examiner

*Primary Examiner* — Alfred J Wujciak
(74) *Attorney, Agent, or Firm* — Muncy, Geissler, Olds & Lowe, P.C.

(57) ABSTRACT

A supporting frame is provided, which includes a base, a mandrel, an elastic body, a first cam, a second cam, an arm, and a first pivoting element. When the arm pivotally rotates with respect to the base, the mandrel rotates along with the arm and one of the first cam and the second cam is driven to rotate, the first cam and the second cam then push against each other so that the first cam moves along the first direction and deforms the elastic body, thereby, the display can stop at any height between the highest position and the lowest position.

9 Claims, 7 Drawing Sheets

SUPPORTING FRAME

CROSS REFERENCE TO RELATED APPLICATION

This application claims the benefits of the Taiwan Patent Application Serial Number 106210320, filed on Jul. 13, 2017, the subject matter of which is incorporated herein by reference.

BACKGROUND OF THE INVENTION

1. Field of the Invention

The present invention relates to a supporting frame. More particularly, the present invention relates to a supporting frame having a four-bar linkage.

2. Description of Related Art

U.S. Pat. No. 7,252,277 has disclosed a support comprising a proximal connector, a remote connector, a first rod, a second rod, an elastic body, and a roller. The first rod is pivoted to the proximal connector and the second rod is pivoted to the remote connector; therefore, the proximal connector, the remote connector, the first rod, and the second rod are together configured to a four-bar linkage. Further, the elastic body and the roller are disposed in a sliding slot of the second rod. When the first rod and the second rod rotate with respect to the proximal connector, the roller scrolls at the peripheral edge of the proximal connector and drives the elastic body to deform. Accordingly, different supporting force may be generated while the support is moving up and down.

However, the second rod of the above-mentioned support must have the sliding slot for accommodating the elastic body; therefore, the second rod has complex structure and is disadvantageous of larger size and difficult assembly process.

Accordingly, the present invention provides a novel supporting frame having simple structure and simplified assembly process; therefore, the supporting frame is highly required and has potential in the industry.

SUMMARY OF THE INVENTION

To achieve the object, a supporting frame is provided to support a display. The supporting frame mainly comprises a base including a first fixing element and a second fixing element; a mandrel disposed on the base, extending along a first direction, and including a first end and a second end corresponding to the first end, the first end is rotatably disposed on the first fixing element of the base; an elastic body sets on the mandrel, abutting against the first fixing element, and constantly providing an elastic force; a first cam slidably sets on the mandrel and abutting against the elastic body; a second cam sets on the mandrel and abutting against the first cam and the second fixing element; an arm disposed on the base and having an upper end and a lower end corresponding to the upper end, the lower end is fastened to the second end of the mandrel; and a first pivoting element pivoted to the upper end of the arm and bearing the display. When the arm pivotally rotates with respect to the base, the mandrel rotates along with the arm and one of the first cam and the second cam is driven to rotate, the first cam and the second cam then push against each other so that the first cam moves along the first direction and deforms the elastic body, thereby, the display can stop at any height with respect to the supporting frame.

In one embodiment of the present invention, the first cam includes at least one first protruding part and at least one first concave surface, the second cam includes at least one second protruding part and at least one second concave surface, wherein the first protruding part and the second protruding part conform to each other.

In one preferred embodiment, the first cam may include two first protruding parts and two first concave surfaces; and the second cam may include two second protruding parts and two second concave surfaces, wherein the first concave surfaces and the second concave surfaces may conform to each other. However, in other embodiments, the number of the first protruding part of the first cam and the number of the second protruding parts of the second cam is not particularly limited, as long as the numbers of the first protruding parts and the second protruding parts are the same and the first protruding parts may conform to the second protruding parts.

In one embodiment of the present invention, the first protruding part has a first inclined surface and a second inclined surface, the second protruding part has a third inclined surface and a fourth inclined surface, wherein the first inclined surface and the second inclined surface have different inclined angles, and the third inclined surface and the fourth inclined surface have different inclined angles.

In one embodiment of the present invention, the first cam has a first through hole, the second cam is fixed to the second fixing element and has a second through hole, wherein a cross-section shape of the first through hole is the same as a cross-section shape of the mandrel, and a cross-section shape of the second through hole is different to the cross-section shape of the mandrel, thereby, the first cam is driven to rotate when the mandrel rotates. When the first cam rotates, the first cam pushes the second cam so that the first cam may move along the first direction with respect to the second cam and the mandrel.

In another embodiment of the present invention, the first cam has a first through hole and the second cam has a second through hole, wherein a cross-section shape of the first through hole is different to a cross-section shape of the mandrel, and a cross-section shape of the second through hole is the same as the cross-section shape of the first mandrel, thereby, the second cam is driven to rotate when the mandrel rotates. When the second cam rotates, the second cam pushes the first cam so that the first cam may move along the first direction with respect to the second cam and the mandrel.

In one embodiment of the present invention, the supporting frame further includes a second pivoting element pivoted to the arm.

In one embodiment of the present invention, the arm includes a first rod and a second rod, the first rod has the upper end and the lower end and the second rod has a third end and a fourth end corresponding to the third end, the upper end and the third end is pivoted to the first pivoting element, and the lower end and the fourth end is pivoted to the second pivoting element, so that the first rod, the first pivoting element, the second rod, and the second pivoting element are configured to a four-bar linkage.

In one embodiment of the present invention, the first fixing element has an adjustment ring which sets on the mandrel and abuts against the elastic body.

In one embodiment of the present invention, the adjustment ring is a screw nut with an internal thread, an external thread is formed on the first end of the mandrel and matches with the internal thread of the screw nut, thereby a relative position of the adjustment ring to the mandrel is adjustable. For example, when the adjustment ring is adjusted to move toward the second end the mandrel, the elastic body may be preloaded and the preloaded level may further be adjusted to change the pre-elasticity provided by the elastic body. Accordingly, the supporting frame may bear the display with different weight.

DETAILED DESCRIPTION OF THE PREFERRED EMBODIMENT

Hereafter, examples will be provided to illustrate the embodiments of the present invention. Advantages and effects of the invention will become more apparent from the disclosure of the present invention. It should be noted that these accompanying figures are simplified and illustrative. The quantity, shape, and size of components shown in the figures may be modified according to practical conditions, and the arrangement of components may be more complex. Other various aspects also may be practiced or applied in the invention, and various modifications and variations can be made without departing from the spirit of the invention based on various concepts and applications.

Figure 1:
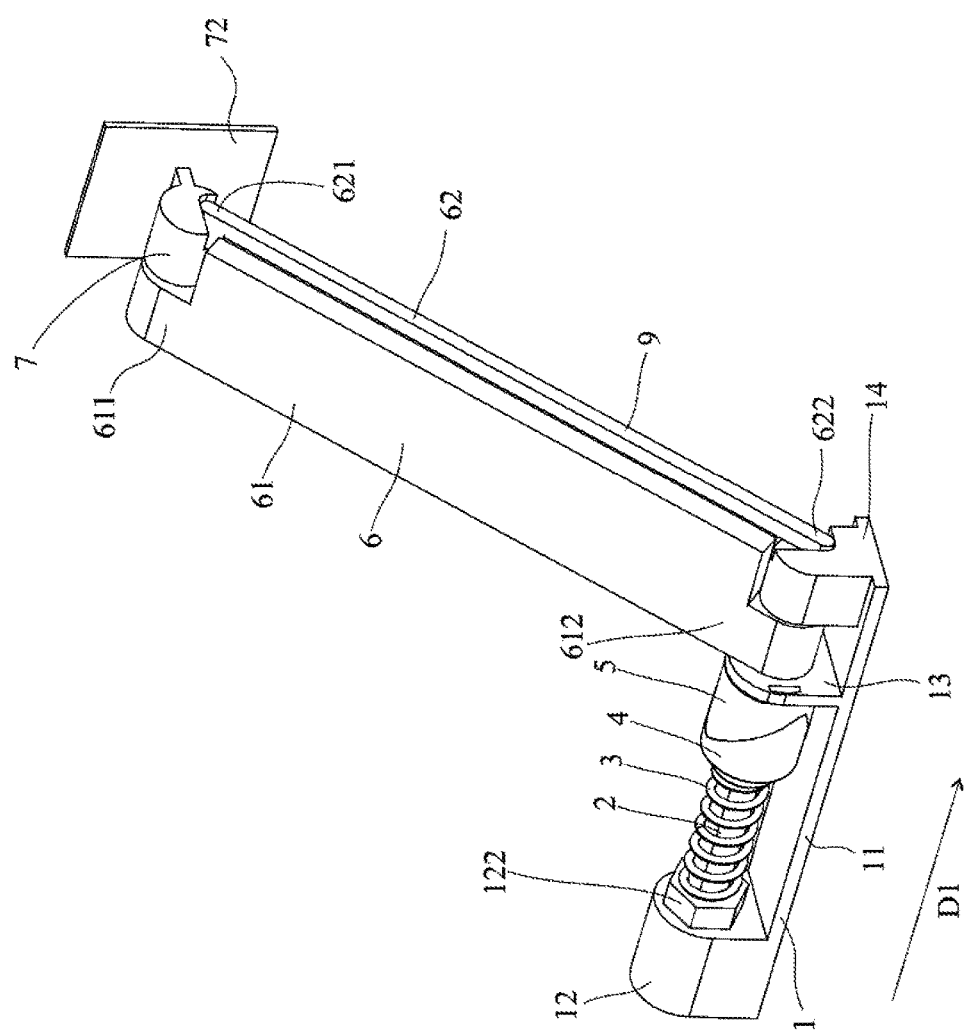
FIG. 1 is a perspective view of the supporting frame of one embodiment of the present invention.
Figure 2:
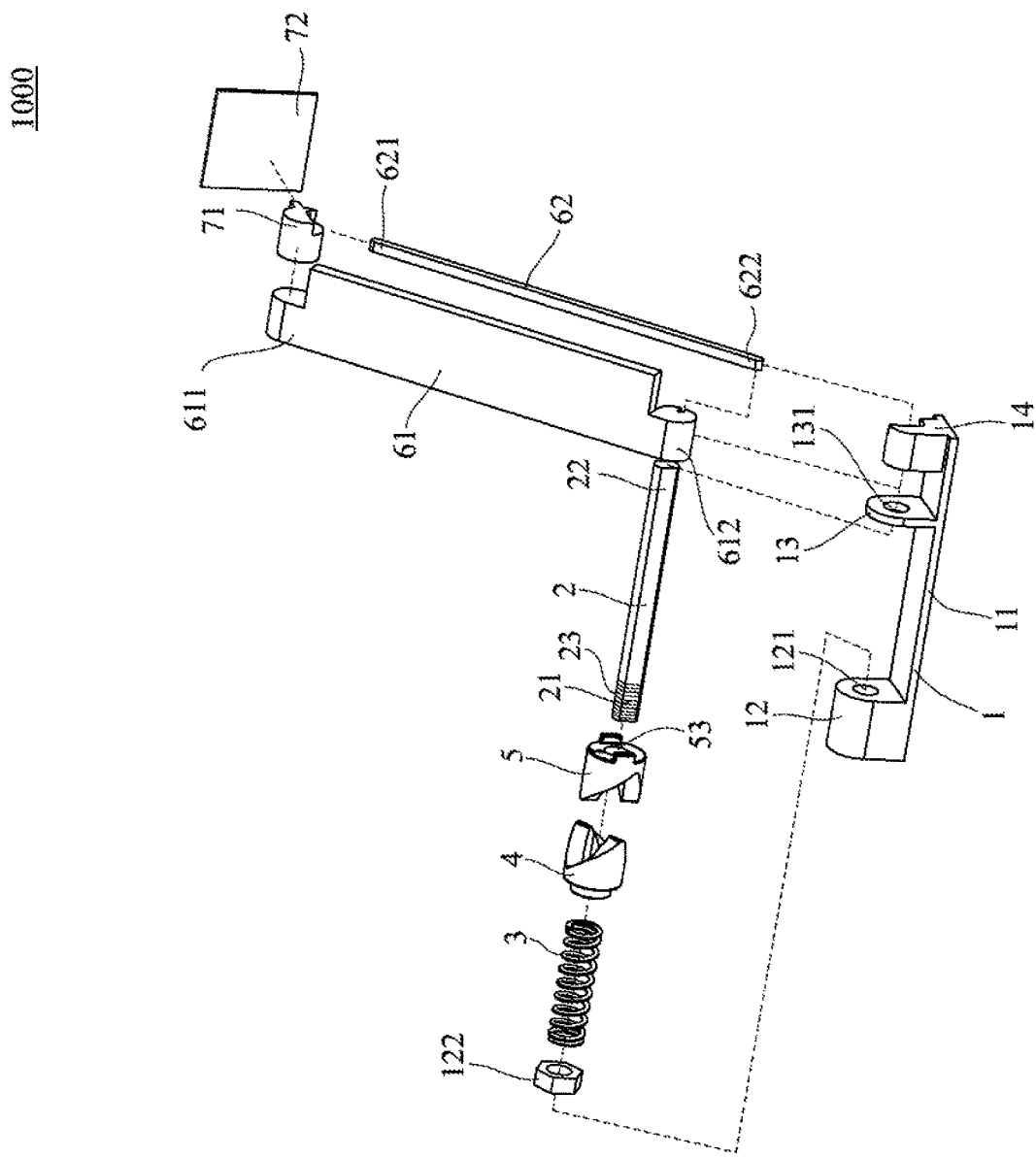
FIG. 2 is an explosive view of the supporting frame of one embodiment of the present invention.

Please refer to the perspective view of FIG. 1 and the explosive view of FIG. 2, the supporting frame 1000 includes a base 1, a mandrel 2, an elastic body 3, a first cam 4, a second cam 5, an arm 6, and a first pivoting element 7. The structure and the connection relationship of each of the elements will be illustrated in the following description.

Firstly, the base 1 includes a plate body 11, a first fixing element 12, and a second fixing element 13. The plate body 11 may be placed on a working surface, the first fixing element 12 has a first via hole 121, and the second element 13 has a second via hole 131, wherein the mandrel 2 extending along a first direction D1 passes through the first via hole 121 and the second via hole 131.

The mandrel 2 has a first end 21 and a second end 22 corresponding to the first end 21, wherein the first end 21 passes through the first via hole 121 and the second end 22 passes through the second via hole 131 so that the mandrel 2 is disposed on the base 1. The mandrel 2 has a non-circular cross-section, and an external thread 23 is formed near the first end 21.

The first fixing element 12 further includes an adjusting ring 122, which sets on the mandrel 2 and near the first end 21. In the present embodiment, the adjustment ring 122 is a screw nut with an internal thread, which matches with the external thread 23, and disposed at the first end 21 of the mandrel 2. However, the method for slipping the adjusting ring 122 over the mandrel 2 is not particularly limited. The position of the adjustment ring 122 with respect to the mandrel 2 may be adjusted so that the preloaded level of the elastic body 3 may be adjusted (before the arm 6 pivots with respect to the base) to change the pre-elasticity provided by the elastic body 3.

The elastic body 3 sets on the mandrel 2, and one end of the elastic body 3 abuts against the adjustment ring 122 while another end thereof abuts the first cam 4. In the present embodiment, the elastic body 3 is a spring but is not limited thereto.

The first cam 4 slidably sets on the mandrel 2 and adjacent to the second end 22. The first cam 4 rotates together with the mandrel 2 and moves along the first direction D1 with respect to the mandrel 2. Accordingly, the elastic body 3 may have various degree of deformation.

The second cam 5 sets on the mandrel 2, fixes to the second fixing element 13 and contacts to the first cam 4. However, the second cam 5 will not rotate together with the mandrel 2 or move along the first direction D1 with respect to the mandrel 2.

Figure 3:
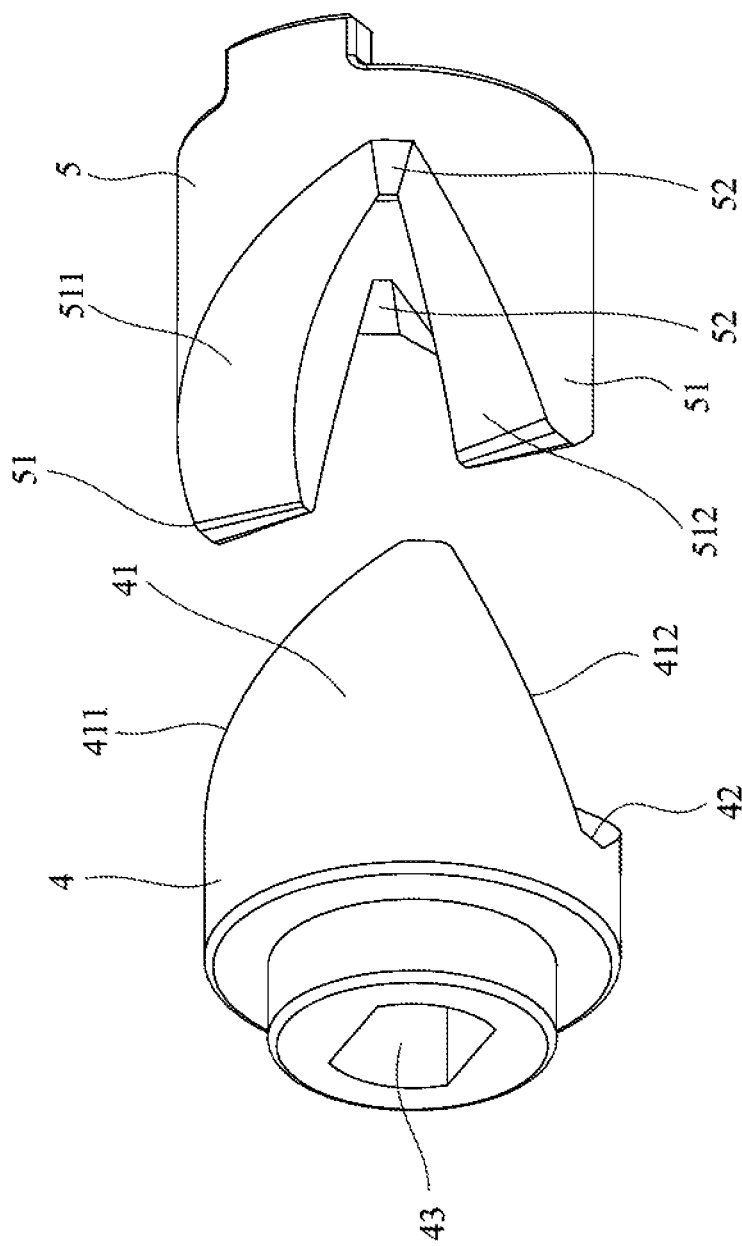
FIG. 3 is a portion perspective view of the supporting frame of one embodiment of the present invention.
Figure 4:
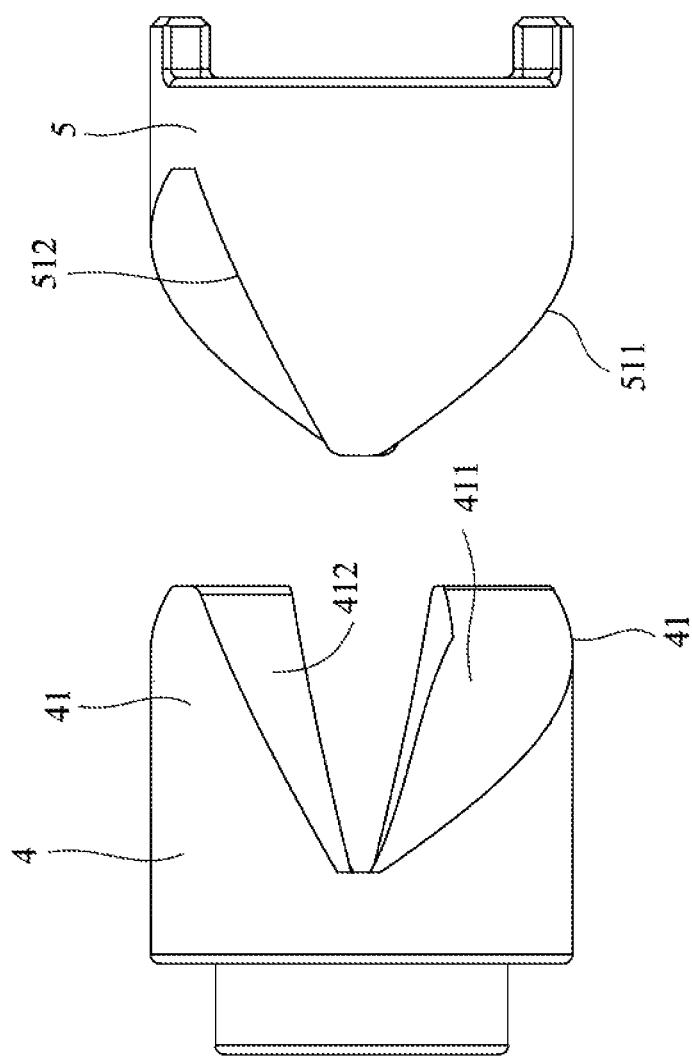
FIG. 4 is a portion perspective view of the supporting frame of one embodiment of the present invention.

Furthermore, as illustrated in FIG. 3, the first cam 4 includes two first protruding parts 41, two first concave surfaces 42, and a first through hole 43; the second cam 5 includes two second protruding parts 51, two second concave surfaces 52, and a second through hole 53 (refer to FIG. 2). In the first cam 4, each of the first protruding parts 41 has a first inclined surface 411 and a second inclined surface 412. Please refer to FIG. 4, the first inclined surface 411 and the second inclined surface 412 have different inclined angles, and as illustrated in the figures, each of the first concave surfaces 42 is adjacent to the first inclined surface 411 and the second inclined surface 412. Similarly, in the second cam 5, each of the second protruding parts 51 has a third inclined surface 511 and a fourth inclined surface 512, and the third inclined surface 511 and the fourth inclined surface 512 have different inclined angles. Also, each of the second concave surfaces 52 is adjacent to the third inclined surface 511 and the fourth inclined surface 512.

More specifically, as illustrated in FIG. 1, the outer contour of the first protruding parts 41 and the first concave surfaces 42 matches with the outer contour of the second protruding parts 51 and the second concave surface 52. When the first cam 4 engages to the second cam 5, the first inclined surfaces 411 contact with the third inclined surfaces 511, and the second inclined surfaces 412 contact with the fourth inclined surfaces 512.

Figure 5:
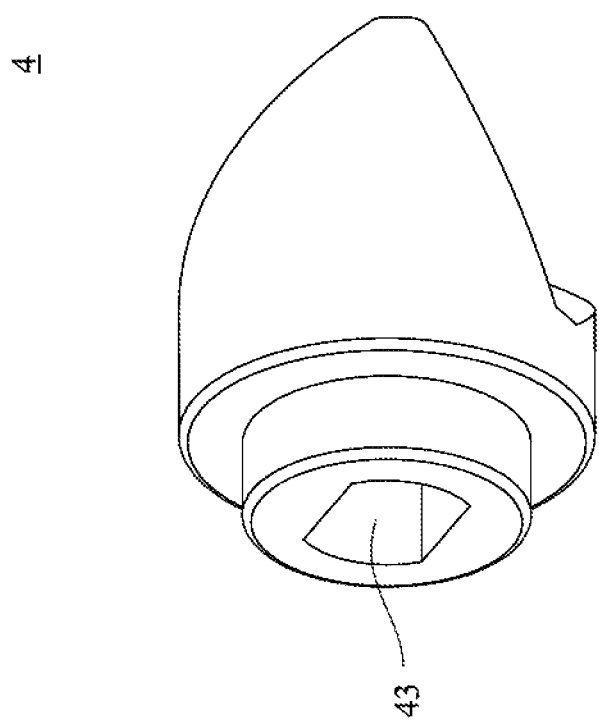
FIG. 5 is an explosive view of the first cam of one embodiment of the present invention.
Figure 6:
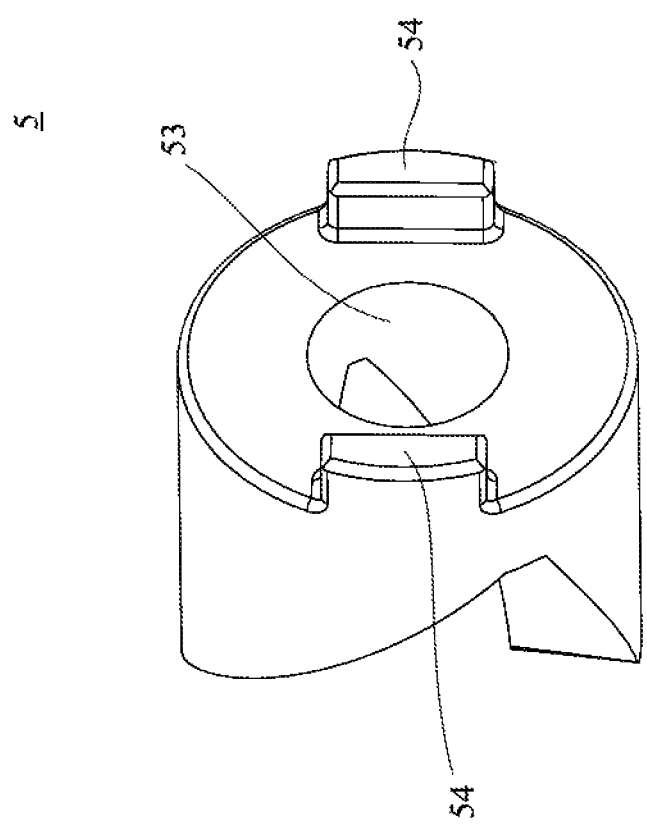
FIG. 6 is an explosive view of the second cam of one embodiment of the present invention.

In addition, please refer to the first cam 4 illustrated in FIG. 5, the cross-section shape of the first through hole 43 of the first cam 4 conforms to the cross-section shape of the mandrel 2; therefore, the first cam 4 may rotate when the mandrel 2 rotates. Please refer to the second cam 5 illustrated in FIG. 6, the cross-section shape of the second through hole 53 (round shape) does not conform to the cross-section shape of the mandrel 2; therefore, the mandrel 2 may rotate freely with respect to the second through hole 53 without driving the second cam 5 to rotate together. Also, as illustrated in FIG. 6, the second cam 5 further includes two bumps 54, and the bumps 54 may engage to the second fixing element 13.

In addition, the arm 6 includes a first rod 61 and a second rod 62, wherein the first rod 61 has an upper end 611 and a lower end 612 corresponding to the upper end 611; the second rod 62 has a third end 621 and a fourth end 622 corresponding to the third end 621. The lower end 612 of the first rod 61 fixes to the second end 22 of the mandrel 2, and the arm 6 is vertical to the first direction D1 and may rotate with respect to the base 1. Accordingly, when the arm 6 rotates with respect to the base 1, the mandrel 2 is driven to rotate, and the first cam 4 rotates together with the mandrel 2. In other words, when the arm 6 rotates, the mandrel 2, the first cam 4, and the arm 6 rotate simultaneously.

Further, the first pivoting element 7 has a pivot base 71 and a connecting unit 72, which connect to each other. The pivot base 71 pivotally connects to the upper end 611 of the first rod 61 and the third end 621 of the second rod 62 respectively. A display (not shown in the figures) can be mounted on the connecting unit 72.

Specifically, the base 1 further comprises a second pivoting element 14 disposed on the plate body 11, and the second pivoting element 14 pivotally connects to the lower end 612 of the first rod 61 and the fourth end 622 of the second rod 62 respectively. Therefore, the first rod 61, the second rod 62, the first pivoting element 7, and the second pivoting element 14 are together configured to a four-bar linkage.

Figure 7:
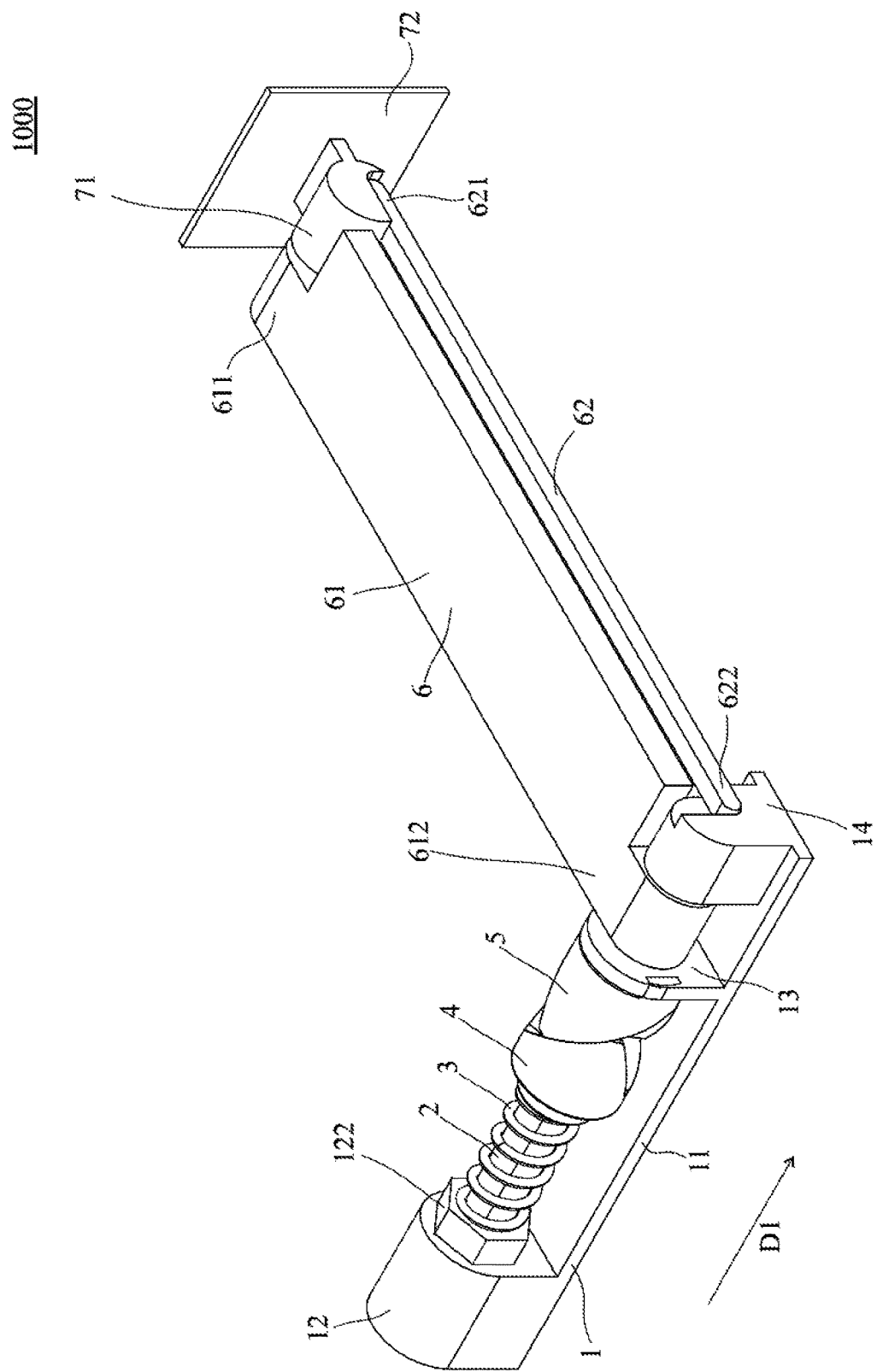
FIG. 7 is an action schematic view of the supporting frame of one embodiment of the present invention.

In the present embodiment, when the display (not shown in the figures) is mounted on the connecting unit 72 and at its highest position (as illustrated in FIG. 1), the moment generated by the weight of the display (assuming that the weight and the frictional force of the other components are ignored) is constantly balanced with the moment generated by the elastic force provided by the elastic body 3. During the process of moving the display and the connecting unit 72 to the lowest position illustrated in FIG. 7 by force, the moment generated by the weight of the display increases so that the arm 6 pivotally rotates downward with respect to the base 1. When the arm 6 rotates with respect to the second pivoting element 14, the arm 6 drives the mandrel 2 and the first cam 4 to rotate together. When the first cam 4 rotates, the first inclined surfaces 411 of the first protruding parts 4 of the first cam 4 respectively abut against and push the third inclined surfaces 511 of the second protruding parts 51 so that the first inclined surfaces 411 and the third inclined surfaces 511 gradually shift. The first cam 4 moves away from the second end 22 of the mandrel 2 along the first direction D1. At the meantime, the second inclined surfaces 412 and the fourth inclined surfaces 512 are separated. As illustrated in FIG. 7, the first cam 4 pushes the second cam 5 by rotation and compresses the elastic body 3 when leaving the second end 22 of the mandrel 2. The compressed elastic body 3, therefore, provides a larger elastic force. Accordingly, the elastic force may compete with the moment generated by the weight of the display and provide support when the display is moving up and down so that the display may stop at any height between the highest position and the lowest position.

In addition, in another embodiment of the present invention, the cross-section shape of the first through hole 43 of the first cam 4 does not conform to the cross-section shape of the mandrel 2 (such as round shape), however the cross-section shape of the second through hole 53 of the second cam 5 conforms to the cross-section shape of the mandrel 2. Also, the second cam 5 does not fix to the second fixing element 13 but abuts against the second fixing element 13. Therefore, when the mandrel 2 rotates, the first cam 4 does not rotate together but the second cam 5 rotates together with the mandrel 2. In this case, during the process of moving the display and the connecting unit 72 from the highest position to the lowest position by force, the arm 4 rotates with respect to the mandrel 2 as the axis and drives the mandrel 2 and the second cam 5 to rotate simultaneously. When the second cam 5 rotates, the second cam 5 pushes the first cam 4 so that the first cam 4 moves away from the second end 22 of the mandrel 2 and compresses the elastic body 3. The compressed elastic body 3 may provide larger elastic force to compete with moment generated by the weight of the display so that the display may stop at any height.

In addition, in other embodiment of the present invention, the effect of bearing the display may still be achieved and the display may still stop at any height when the second rod 62 is removed.

In summary, the supporting frame of the present invention is highly potential in the industry due to the advantages of simple structure, easy assembling process, and small size.

Although the present invention has been explained in relation to its preferred embodiment, it is to be understood that many other possible modifications and variations can be made without departing from the spirit and scope of the invention as hereinafter claimed.

What is claimed is:

1. A stand utilized for supporting a display, comprising:
 a base including a first fixing element and a second fixing element;
 a mandrel being disposed on the base, extending along a first direction, and including a first end and a second end corresponding to the first end, wherein the first end is rotatably disposed on the first fixing element of the base;
 an elastic body setting on the mandrel, abutting against the first fixing element and constantly providing an elastic force;
 a first cam slidably setting on the mandrel and abutting against the elastic body;
 a second cam setting on the mandrel and abutting against the first cam and the second fixing element;
 an arm being disposed on the base and pivoted between a highest position and a lowest position, wherein the arm has an upper end and a lower end corresponding to the upper end, and the lower end is fastened to the second end of the mandrel; and
 a first pivoting element being pivotally fixed to the upper end of the arm and bearing the display;
 wherein when the arm pivotally rotate with respect to the base, the mandrel rotates along with the arm and one of the first cam and the second cam is driven to rotate, the first cam and the second cam then push against each other so that the first cam moves along the first direction and deforms the elastic body; thereby, the display can stop at any height between the highest position and the lowest position.

2. The stand as claimed in claim 1, wherein the first cam includes at least one first protruding part and at least one first concave surface, the second cam includes at least one second protruding part and at least one second concave surface, wherein the first protruding part and the second protruding part conform to each other.

3. The stand as claimed in claim 2, wherein the first protruding part has a first inclined surface and a second inclined surface, the second protruding part has a third inclined surface and a fourth inclined surface, wherein the first inclined surface and the second inclined surface have different inclined angles, and the third inclined surface and the fourth inclined surface have different inclined angles.

4. The stand as claimed in claim 3, wherein the first cam has a first through hole, the second cam fixes to the second fixing element and has a second through hole, wherein a cross-section shape of the first through hole is the same as a cross-section shape of the mandrel, and a cross-section shape of the second through hole is different to the cross-section shape of the mandrel; thereby, the first cam is driven to rotate when the mandrel rotates.

5. The stand as claimed in claim 3, wherein the first cam has a first through hole and the second cam has a second through hole, wherein a cross-section shape of the first through hole is different to a cross-section shape of the mandrel, and a cross-section shape of the second through hole is the same as the cross-section shape of the first mandrel; thereby, the second cam is driven to rotate when the mandrel rotates.

6. The stand as claimed in claim 1, wherein the base further includes a second pivoting element pivotally fixed to the arm.

7. The stand as claimed in claim 6, wherein the arm includes a first rod and a second rod, the first rod has the upper end and the lower end, and the second rod has a third end and a fourth end corresponding to the third end, wherein the upper end and the third end pivotally fix to the first pivoting element, and the lower end and the fourth end pivotally fix to the second pivoting element, so that the first rod, the first pivoting element, the second rod, and the second pivoting element are configured to a four-bar linkage.

8. The stand as claimed in claim 1, wherein the first fixing element has an adjustment ring which sets on the mandrel and abuts against the elastic body.

9. The stand as claimed in claim 8, wherein the adjustment ring is a screw nut with an internal thread, an external thread is formed on the first end of the mandrel and matches with the internal thread of the screw nut, and thereby a relative position of the adjustment ring to the mandrel is adjustable.

* * * * *